(12) United States Patent
Kuipers et al.

(10) Patent No.: US 12,244,759 B2
(45) Date of Patent: Mar. 4, 2025

(54) DETECTING A SINGLE WIRE INTERRUPTION

(71) Applicant: Adtran GmbH, Berlin (DE)

(72) Inventors: Martin Kuipers, Dallgow-Döberitz (DE); Nils Asmussen, Munich (DE)

(73) Assignee: Adtran GmbH, Berlin (DE)

( * ) Notice: Subject to any disclaimer, the term of this patent is extended or adjusted under 35 U.S.C. 154(b) by 104 days.

(21) Appl. No.: 17/637,923

(22) PCT Filed: Sep. 5, 2019

(86) PCT No.: PCT/EP2019/073756
§ 371 (c)(1),
(2) Date: Feb. 24, 2022

(87) PCT Pub. No.: WO2021/043410
PCT Pub. Date: Mar. 11, 2021

(65) Prior Publication Data
US 2022/0317173 A1   Oct. 6, 2022

(51) Int. Cl.
H04M 3/30  (2006.01)
H04B 3/46  (2015.01)
H04M 1/24  (2006.01)
H04M 3/28  (2006.01)
G01R 31/08  (2020.01)

(52) U.S. Cl.
CPC ............. *H04M 3/305* (2013.01); *H04B 3/46* (2013.01); *H04M 1/24* (2013.01); *H04M 3/28* (2013.01); *H04M 3/30* (2013.01); *H04M 3/301* (2013.01); *H04M 3/306* (2013.01); *G01R 31/081* (2013.01)

(58) Field of Classification Search
None
See application file for complete search history.

(56) References Cited

U.S. PATENT DOCUMENTS

| | | | | |
|---|---|---|---|---|
| 5,864,602 A | * | 1/1999 | Needle | G01R 31/58 324/519 |
| 6,233,312 B1 | * | 5/2001 | Chaskell | G01R 31/58 379/22 |
| 6,389,109 B1 | * | 5/2002 | Schmidt | H04M 3/306 379/1.04 |
| 6,950,497 B2 | * | 9/2005 | Drury | H04M 3/085 379/1.01 |
| 6,985,444 B1 | * | 1/2006 | Rosen | H04L 41/00 379/1.04 |
| 7,804,940 B2 | * | 9/2010 | Huang | H04L 43/50 379/27.01 |

(Continued)

OTHER PUBLICATIONS

International Preliminary Report on Patentability in International Appln. No. PCT/EP2019/073756, dated Mar. 8, 2022, 6 pages.

(Continued)

*Primary Examiner* — Quoc D Tran
(74) *Attorney, Agent, or Firm* — Fish & Richardson P.C.

(57) ABSTRACT

It is suggested to detect a single wire interruption (SWI) of a line comprising two wires, wherein such line is part of a vectoring group, comprising (i) determining a capacitance between the single wires of the line; and (ii) determining whether a single wire interruption is present based on the determined capacitance.

14 Claims, 7 Drawing Sheets

(56) References Cited

U.S. PATENT DOCUMENTS

| | | | |
|---|---|---|---|
| 2002/0090060 A1* | 7/2002 | Rudinsky | H04B 3/46 |
| | | | 379/27.01 |
| 2003/0021388 A1* | 1/2003 | Starr | H04M 1/24 |
| | | | 379/1.04 |
| 2003/0048878 A1 | 3/2003 | Drury et al. | |
| 2005/0135567 A1* | 6/2005 | Faulkner | H04B 3/48 |
| | | | 379/22 |
| 2010/0114529 A1* | 5/2010 | May | H04B 3/487 |
| | | | 702/183 |
| 2014/0270094 A1* | 9/2014 | Drooghaag | H04M 3/08 |
| | | | 379/1.04 |
| 2015/0063551 A1* | 3/2015 | Kuipers | H04B 3/487 |
| | | | 379/28 |
| 2015/0334225 A1 | 11/2015 | Bull et al. | |
| 2019/0036800 A1 | 1/2019 | Kuipers et al. | |

OTHER PUBLICATIONS

International Search Report and Written Opinion in International Appln. No. PCT/EP2019/073756, dated Oct. 10, 2019, 8 pages.

* cited by examiner

DETECTING A SINGLE WIRE INTERRUPTION

CROSS REFERENCE TO RELATED APPLICATIONS

This application is a National Phase application under 35 U.S.C. § 371 of PCT International Application number PCT/EP2019/073756, filed Sep. 5, 2019. The entire contents of this application is hereby incorporated by reference.

BACKGROUND

This specification relates to detection of single wire interruption of a line, wherein such line is part of a vectored group.

SUMMARY

Embodiments of the subject matter described in this specification can include methods for detecting a single wire interruption of a line comprising two single wires, wherein such line is part of a vectoring group. The methods can include determining an overall capacitance measured between the two single wires of the line; determining a line capacitance of the line; and determining that a single wire interruption is present in at least one of the two single wires based on a difference between the overall capacitance and the line capacitance being less than a specified value.

The vectoring group can be utilized by a vectoring system. The vectoring system can utilize a G.fast service. The vectoring system can utilize a start frequency of at least 1 MHZ, in particular 2.2 MHz.

The methods can include determining a terminal capacitance of a terminal connected to the line. Determining the overall capacitance can include determining the overall capacitance via metallic line testing (MELT). Determining the line capacitance can include determining the line capacitance based on an attenuation of a signal and/or based on a signal propagation delay. Determining that the single wire interruption is present can include determining that the single wire interruption is present based on (i) the difference between the overall capacitance and the line capacitance and (ii) the terminal capacitance. Determining that the single wire interruption is present can include determining that the following condition is met:

$$C_{meas} - C_{line} < th,$$

where
$C_{meas}$ indicates the overall capacitance,
$C_{line}$ indicates the line capacitance, and
th is the specified value selected from $C_{CPE}/2$ or a range around $C_{CPE}/2$,
wherein $C_{CPE}$ is the CPE capacitance.

The method can be run on a central unit, in particular a distribution point unit (DPU), a digital subscriber line access multiplexer (DSLAM), a multi service access node (MSAN) or a media converter.

A predetermined action can be triggered in case of at least one of the following: a single wire interruption is detected; a single wire interruption is not detected; or a single wire interruption is no longer detected. The predetermined action can include at least one of the following: issuing a notification, in particular an alarm notification; using a reduced frequency range after the single wire interruption has been detected; deactivating the line for which the single wire interruption has been detected; using a reduced transmit power; or using a reduced power spectral density level.

Other embodiments can include corresponding systems and non-transitory computer readable medium.

DETAILED DESCRIPTION

Examples described herein relate to a detection of single wire interruption of a line, wherein such line is part of a vectored group.

xDSL (also referred to as DSL) is a family of technologies that provide digital data transmission over the wires of a local telephone network.

Data transmission via copper-based access networks is facilitated via xDSL based on ITU-T specifications G.99x.y. G.fast services may be implemented based on ITU-T specifications G.9700 and G.9701. G.fast provides higher data rates compared to xDSL.

A network operator provides xDSL services that are supported by an Access Node (AN) located in the Central Office (a building) or in a cabinet (in the street). The AN may also be referred to as DSLAM or MSAN.

A service might be deployed via ANs that are referred to as Distribution Point Units (DPUs), which support G.fast on the existing copper wires. The DPU may be deployed at a location different from the existing AN. For example, the DPU can be deployed in a basement of a building as Fiber to the Building (FTTB), in an outside Distribution Point as Fiber to the Distribution Point (FTTDP) or in an outside Cabinet as Fiber to the Cabinet (FTTC).

In an exemplary use case, a G.fast distribution point unit (DPU) may be installed in the basement of the building using existing telephone wires in the building to provide high-speed internet access. The uplink from the DPU towards the network is realized in most cases by a different technology, like an optical fiber.

Vectoring enables data transmission at high data rates by compensation of self-crosstalk. The cancellation of crosstalk increases the effective signal-to-noise ratio so that more information can be transmitted on individual subcarriers. This makes the system more vulnerable to noise that cannot be compensated (e.g. alien crosstalk, VDSL2 or other G.fast systems in the same cable binder, RFI ingress, impulse noise, etc.).

Due to the cancellation of self-FEXT, the low level of background noise causes the signal-to-noise ratio to be more susceptible than without vectoring. Hence, the transmission is prone to disturbers that cannot be cancelled. If the disturbance is strong enough, data transmission may become impossible and the line needs to re-initialize.

Similar effects can occur if crosstalk coupling between lines or signal levels change suddenly because the vectoring system needs time to measure the characteristics of the new crosstalk channels and adapt to the new situation.

Figure 1:
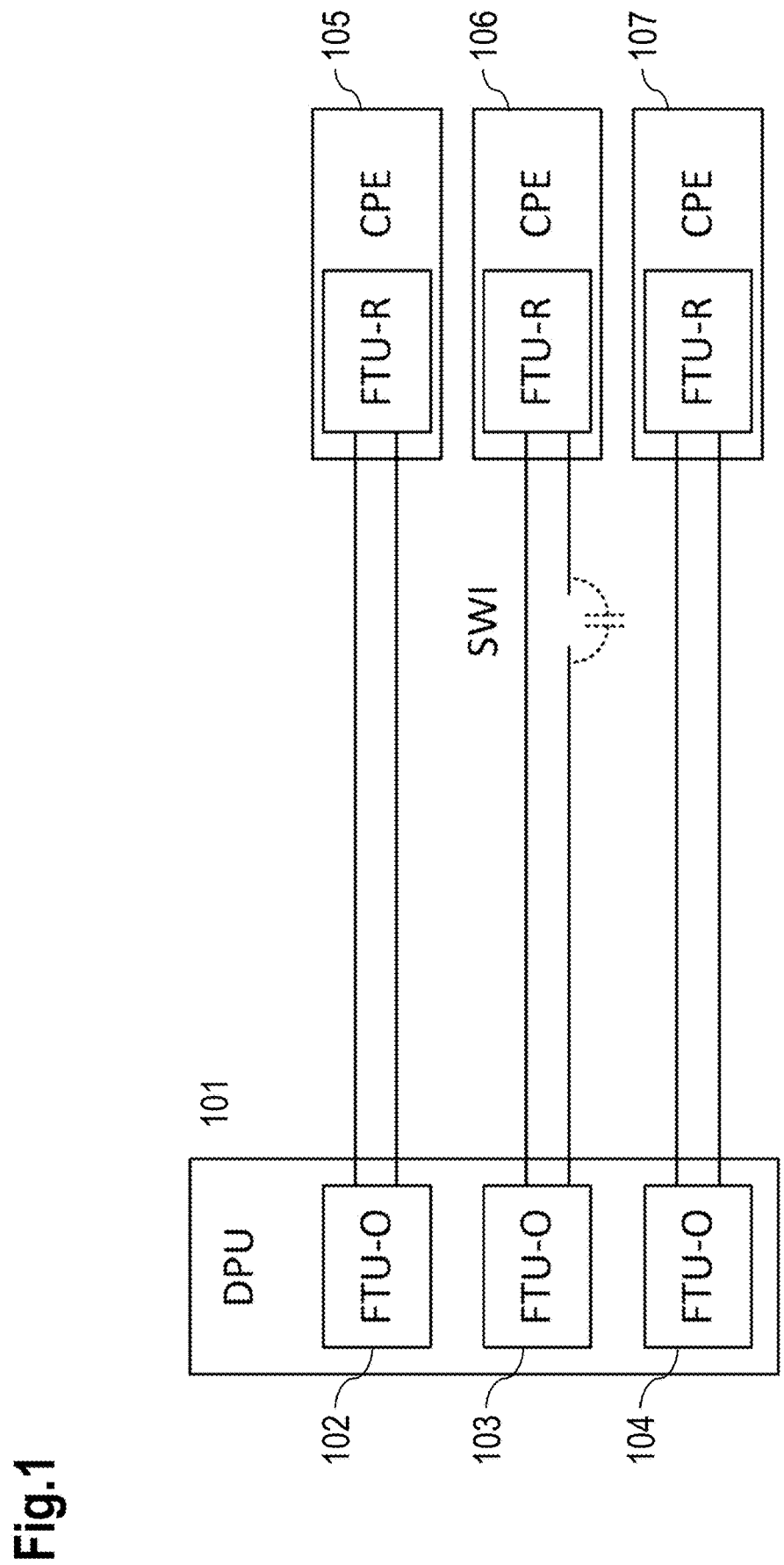
FIG. 1 shows an exemplary scenario of a G.fast vectoring system with a single wire interruption.

FIG. 1 shows an exemplary scenario of a G.fast vectoring system with a single wire interruption.

A DPU 101 comprises three FTU-Os 102 to 104, wherein each of the FTU-Os 102 to 104 is connected via a wire pair (also referred to as line) to an FTU-R of a CPE 105 to 107. In this example, one of the wires between the FTU-O 103 and the CPE 106 is interrupted (which is also referred to as SWI, Single Wire Interruption).

According to FIG. 1, the G.fast system with three lines comprises a vectored group and the SWI occurs within one line of this vectored group.

It is assumed that all modems (FTU-Rs at the CPEs 105 to 107) are in a showtime state and perform vectoring when the SWI near the CPE 106 or at any other location of the cable occurs. The reason for the SWI may be an actual break of the wire or it may be based on a corroding contact or the like.

The SWI results in a sudden loss of signal level, which may lead to a loss of the showtime state then followed by an attempt to reinitialize the connection. However, the SWI does not mean that the electrical signal between the two modems FTU-O 103 and the CPE 106 is permanently interrupted. As there may be several wire pairs running in parallel in a physical cable, crosstalk between these wire pairs allows for a fraction of the transmitted signal to reach its receiver despite the interruption. In the example of FIG. 1, the interruption between the FTU-O 103 and the CPE 106 may thus at least partially be compensated by crosstalk-effects allowing information to be conveyed between sender and receiver, utilizing, however, a much weaker signal.

This kind of propagation caused by the crosstalk-effects can be modelled by a small capacitor that bridges SWI. Hence, in particular high-frequency signals can pass between the two modems with some additional attenuation.

Since a DC or a low-frequency signal may not be needed for xDSL and/or G.fast communication, the interrupted line may be able to re-initialize its communication link despite the SWI. During (re-)initialization the system adapts to the new channel characteristics including the presence of the SWI, i.e. a highly attenuated signal at lower frequencies. Hence, the line with the SWI may enter the showtime state and becomes part of the vectoring group. The crosstalk between the lines has changed based on the SWI, but the vectoring system has adjusted to the SWI due to the interrupted wire's joining the vectoring group. Eventually, the communication continues "bridging" the SWI.

If the interrupted wire is re-connected, e.g., due to an intermittent contact, the loop attenuation of the affected line is suddenly significantly lower. The signal-to-noise ratio of this line increases and the transmission may continue without errors. On the other hand, the other lines of the vectoring group experience a sudden increase of residual crosstalk based on the SWI suddenly being remedied (see, e.g., ITU G.9701). Such crosstalk ramp may not be compensated immediately, because the vectoring system needs time to adapt to the changed crosstalk situation.

The adaptation of the vectoring system may not be fast enough to prevent lines from losing connectivity. It is even possible that due to the remedy of the SWI, the sudden increase of crosstalk causes loss of showtime for several lines of the vectoring group.

As a result, this may lead to an interruption of the xDSL and/or G.fast connectivity of a complete neighborhood caused by a single subscriber line (in case a previously interrupted wire becomes connected again). Also, an attack towards the vectoring group may be possible by sabotaging a single wire for a predetermined period of time.

Hence, it is an object to reduce the impact of a SWI on a vectoring group.

This problem is solved according to the features of the independent claims. Further embodiments result from the depending claims.

The examples suggested herein may in particular be based on at least one of the following solutions. In particular, combinations of the following features could be utilized in order to reach a desired result. The features of the method could be combined with any feature(s) of the device, apparatus or system or vice versa.

A method is provided for detecting a single wire interruption of a line comprising two wires, wherein such line is part of a vectoring group, comprising:
  determining a capacitance between the single wires of the line;
  determining whether a single wire interruption is present based on the determined capacitance.

It is noted that several lines of the vectoring group may be part of one physical cable (binder).

According to an embodiment, the vectoring group is utilized by a vectoring system.

According to an embodiment, the vectoring system utilizes a G.fast service.

According to an embodiment, vectoring system utilizes a start frequency of at least 1 MHz, in particular 2.2 MHz.

According to an embodiment, determining the capacitance between the single wires of the line comprises:
  determining an overall capacitance;
  determining a line capacitance;
  determining a terminal capacitance.

The terminal capacitance may be a capacitance of a terminal that is attached to the line. This terminal may in particular be a CPE or a modem of a CPE.

According to an embodiment, the overall capacitance is determined via MELT.

According to an embodiment, the line capacitance is determined based on an attenuation of a signal and/or based on a signal propagation delay.

According to an embodiment, the presence of the single wire interruption is determined based on the overall capacitance, the line capacitance and the terminal capacitance.

According to an embodiment, the presence of the single wire interruption is determined based on a difference between the overall capacitance and the line capacitance, which difference is compared with the terminal capacitance and/or another threshold.

According to an embodiment, the presence of the single wire interruption is determined in case the following condition is met:

$$C_{meas} - C_{line} < th,$$

wherein
  $C_{meas}$ indicates the overall capacitance,
  $C_{line}$ indicates the line capacitance, and
  th is a threshold, preferably amounting to $C_{CPE}/2$ or selected from a range around $C_{CPE}/2$, wherein $C_{CPE}$ is the CPE capacitance.

The range around $C_{CPE}/2$ may be from 0 to $C_{CPE}$.

According to an embodiment, the line capacitance is determined based on at least one of the following:
- a k10 method;
- a ToD method;
- a Tg method.

The method according to any of the preceding claims, which is run on a central unit, in particular a DPU, a DSLAM, a MSAN or a media converter.

According to an embodiment, a predetermined action is triggered in case of at least one of the following:
- a single wire interruption is detected;
- a single wire interruption is not detected;
- a single wire interruption is no longer detected.

According to an embodiment, the predetermined action comprises at least one of the following:
- issuing a notification, in particular an alarm notification;
- using a reduced frequency range after the single wire interruption has been detected;
- deactivating the line for which the single wire interruption has been detected;
- using a reduced transmit power;
- using a reduced power spectral density level.

Also, a central communication device is provided comprising a processing unit that is arranged to conduct the following steps:
- determining a capacitance between two single wires of a line, wherein such line is part of a vectoring group;
- determining whether a single wire interruption is present based on the determined capacitance.

According to an embodiment, the device is a DPU, a DSLAM, a MSAN or a media converter.

It is noted that the steps of the method stated herein may be executable on this processing unit as well.

It is further noted that said processing unit can comprise at least one, in particular several means that are arranged to execute the steps of the method described herein. The means may be logically or physically separated; in particular several logically separate means could be combined in at least one physical unit.

Said processing unit may comprise at least one of the following: a processor, a microcontroller, a hard-wired circuit, an ASIC, an FPGA, a logic device.

The solution provided herein further comprises a computer program product directly loadable into a memory of a digital computer, comprising software code portions for performing the steps of the method as described herein.

In addition, the problem stated above is solved by a computer-readable medium, e.g., storage of any kind, having computer-executable instructions adapted to cause a computer system to perform the method as described herein.

Furthermore, the problem stated above is solved by a communication system comprising at least one device as described herein.

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

Examples described herein are directed to a detection of an interrupted wire of a line. When the affected line with an SWI loses its showtime state, the line may re-initialize and a transmission across the line may still be possible when the signal's strength is adjusted to the higher line attenuation based on the capacitive coupling explained above with regard to FIG. 1.

The capacitive coupling can be detected using standard-compliant G.fast test parameters. There are two basic effects that can be detected in case of a SWI:

(1) The attenuation of the line is higher, predominately in the lower frequency range.

(2) The capacitance between the two wires of the line measured by the DPU using MELT is reduced.

There may be a particular capacitance between the two connections of the CPE's G.fast interface. This capacitance is in series with one coil of a transformer and has a minimum value in order to allow for transmission of ITU G.994.1 handshake tones. This capacitance may be in the order of, e.g., 10 nF. It is also referred to as CPE capacitance $C_{CPE}$ (see also capacitance 201 in FIG. 2 below).

Figure 2:
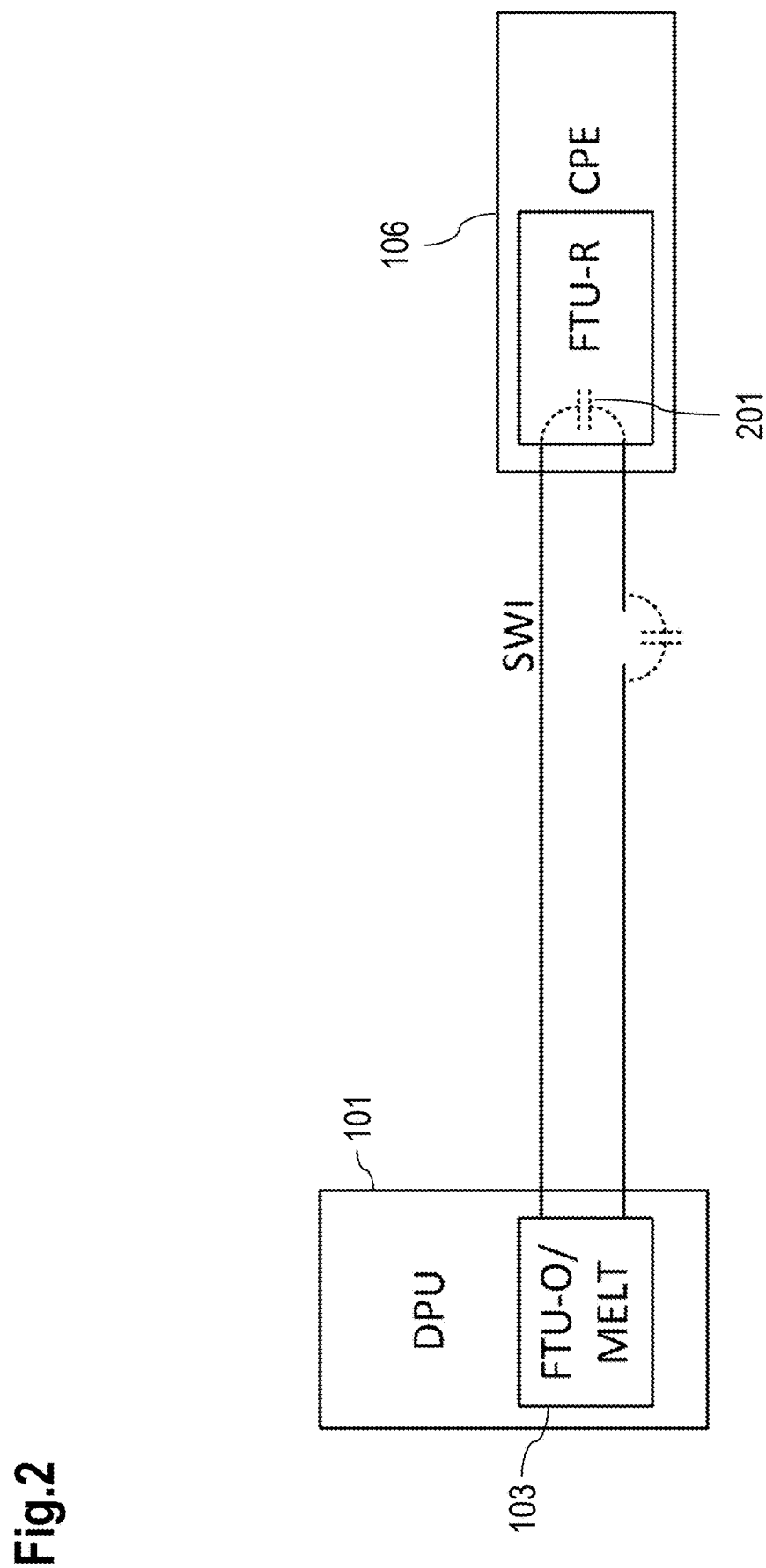
FIG. 2 shows a DPU with an FTU-O, which is connected via two wires to a CPE. wherein one of the wires is interrupted (SWI)

FIG. 2 shows the DPU 101 with the single FTU-O 103, which is connected via two wires to the CPE 106, wherein one of the wires is interrupted (SWI). The remaining FTU-Os and CPEs of FIG. 1 are not shown, but they may be present as well. The FTU-R of the CPE 106 shows a capacitance 201 that can be measured by the FTU-O 103 using MELT.

Without the SWI, the capacitance measured at the DPU by MELT is the sum of the line capacitance $C_{line}$ and the CPE capacitance $C_{CPE}$. With the SWI, only the line capacitance $C_{line}$ from DPU to the interruption is measured. The capacitance between the two interrupted ends of the wire may be negligible. Hence, if the measured capacitance for reasonably short loop length is smaller than the known CPE capacitance $C_{CPE}$, the presence of the SWI is obvious. This may be summarized by the following table:

| Measured capacitance | Result |
| --- | --- |
| $>=C_{CPE}$ | no SWI if capacitance of the uninterrupted line $C_{line}$ is smaller than $C_{CPE}$ |
| $<C_{CPE}$ | SWI detected |

The capacitance of a wire pair may amount to 50 pF/m if its characteristic impedance in the G.fast frequency range is 100 Ohm, which is an exemplary impedance of transmission lines used for DSL or G.fast.

If the known CPE capacitance amounts to 10 nF, it is possible to use the SWI detection with lines up to 200 m. At a length of the line amounting to 200 m, the line capacitance reaches $$200 \text{ m} \cdot \frac{50 \text{ pF}}{m} = 10 \text{ nF},$$

which is in the order of the CPE capacitance $C_{CPE}$.

Figure 3:
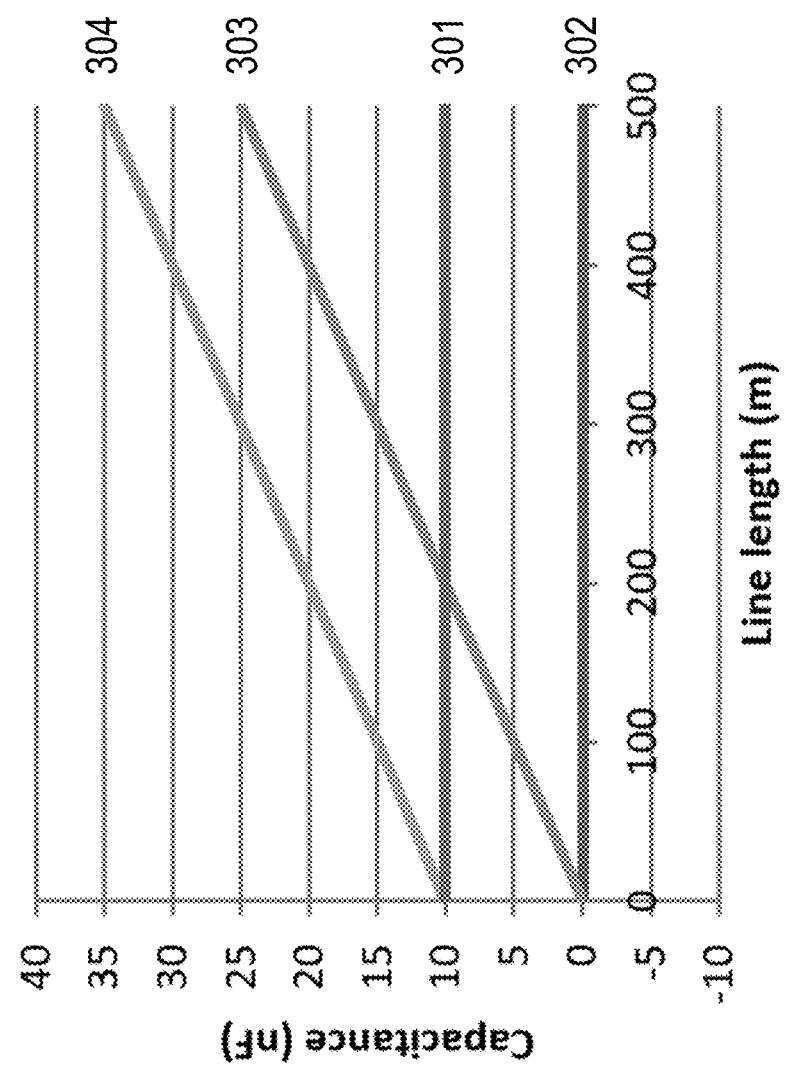
FIG. 3 shows a diagram visualizing a line length in view of a capacitance.

FIG. 3 shows a diagram visualizing the line length in view of the capacitance.

A line length is regarded as the full line length between the DPU 101 and the CPE 106.

A curve 301 is the CPE capacitance that is present if it is measured by MELT with a line length of 0 meters. The CPE capacitance $C_{CPE}$ in this examples amounts to 10 nF.

A curve 302 depicts the lowest possible measured capacitance value when an SWI is present assuming that the interruption is close to DPU. In this example, the capacitance measured amounts to (substantially) 0 F.

A curve 303 shows the highest possible measured capacitance value when an SWI is present assuming that the interruption is close to the CPE 106. Hence, the capacitance measured merely shows the line capacitance $C_{line}$ without the CPE capacitance $C_{CPE}$.

A curve 304 shows the measured capacitance when no SWI is present. Hence, the capacitance measured shows both, the line capacitance $C_{line}$ and the CPE capacitance $C_{CPE}$.

Hence, with an SWI (curves 302 and 303) the measured capacitance is somewhere above curve 302 and below curve 303 depending on the actual location of the interruption. At a line length amounting to 200 m, the curve 303 reaches (intersects with) the curve 301. Therefore, it is not possible to reliably detect the absence of the CPE capacitance $C_{CPE}$ above a line length amounting to (ca.) 200 m.

If the line length is larger than 200 m or in case the CPE capacitance $C_{CPE}$ is smaller than 10 nF, it is advantageous to know the capacitance of the line $C_{line}$ to be able to subtract it from the measured capacitance.

For estimation of the line capacitance $C_{line}$ several approaches may be used.

The k10 method

The k10 method results in a k10 value, also referred to as k10 parameter. For estimating the line length, the k10 parameter (from UPBOKLE, UPBOKLE-R, HLOGpsds or HLOGpsus as described in ITU G.997.2) can be used. The line length in meters and line attenuation in dB may in particular be strictly proportional to each other. The k10 value is measured during the initialization of the G.fast link. It is the so-called electrical length of the line and is the theoretical attenuation at 1 MHz derived from the attenuation of different subcarriers of the G.fast signal.

Unfortunately, there can be many different cable types that have different k10 values for the same length. That means that it is not possible to precisely determine the cable length and thus the cable capacitance. However, the approach may suffice for some (distinct) cable types.

An average cable has a length amounting to 30 m per 1 dB attenuation if the attenuation is measured as k10 value(s). This ratio may vary from 20 m/dB to 40 m/dB depending on the type of cable used. The line capacitance per length may be in the order of 50 pF/m. Hence, the average cable capacitance may amount to 1.5 nF per 1 dB attenuation if the attenuation is measured as k10 value(s). This ratio may respectively vary from 1 nF/dB to 2 nF/dB depending on the type of cable used.

In case an average cable is used and in case of a CPE capacitance $C_{CPE}$ amounting to 10 nF, a line length compensation may work for any line length.

Figure 4:
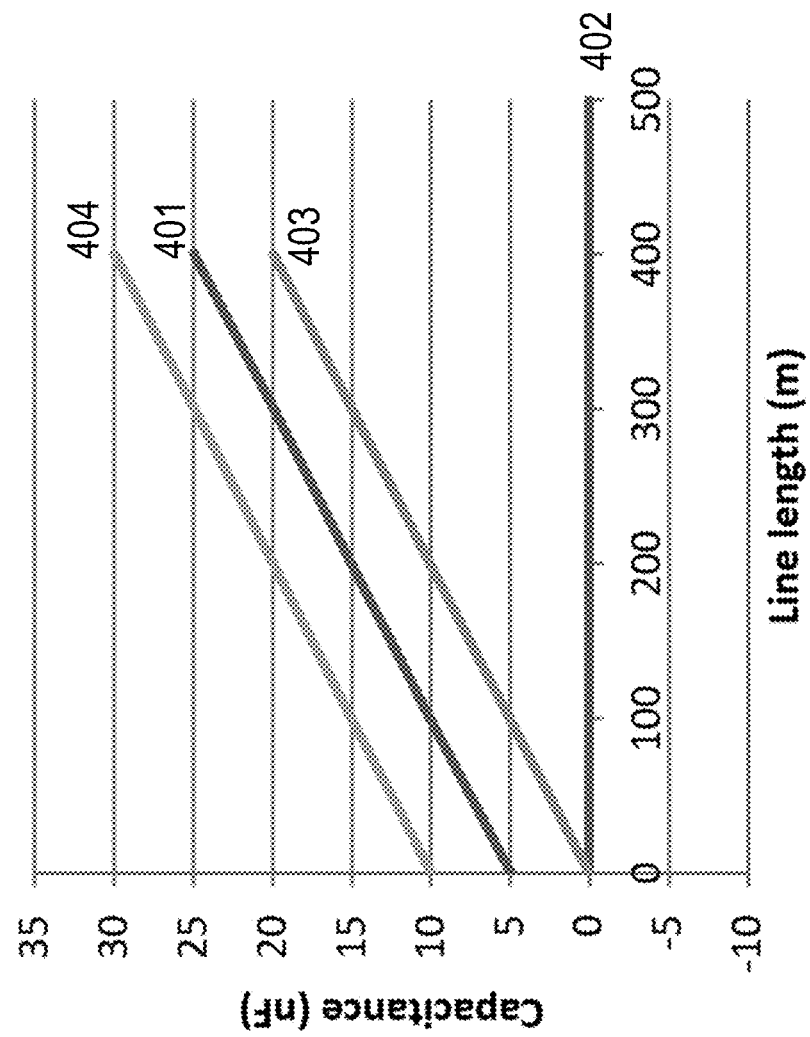
FIG. 4 shows a diagram visualizing the line length in view of the capacitance with line length compensation.

FIG. 4 shows a diagram visualizing the line length in view of the capacitance with line length compensation.

A curve 401 shows a threshold.

A curve 402 depicts the lowest possible measured capacitance value when an SWI is present assuming that the interruption is close to DPU. In this example, the capacitance measured amounts to (substantially) 0 F.

A curve 403 shows the highest possible measured capacitance value when an SWI is present assuming that the interruption is close to the CPE 106. Hence, the capacitance measured merely shows the line capacitance $C_{line}$ without the CPE capacitance $C_{CPE}$.

A curve 404 shows the measured capacitance when no SWI is present. Hence, the capacitance measured shows both, the line capacitance $C_{line}$ and the CPE capacitance $C_{CPE}$.

The SWI is considered present if the measured capacitance value is at or below the threshold 401. There is no SWI if the measured capacitance is above the threshold 401. The SWI detection may be robust against measurement errors in case the threshold 401 is placed around the middle between curve 403 and 404 (in this example starting at a capacitance amounting to 5 nF at a line length of 0 m).

However, the maximum cable length for SWI detection may be limited by the value of the CPE capacitance $C_{CPE}$ and the ratio between the highest and lowest capacitance per k10 values.

Figure 5:
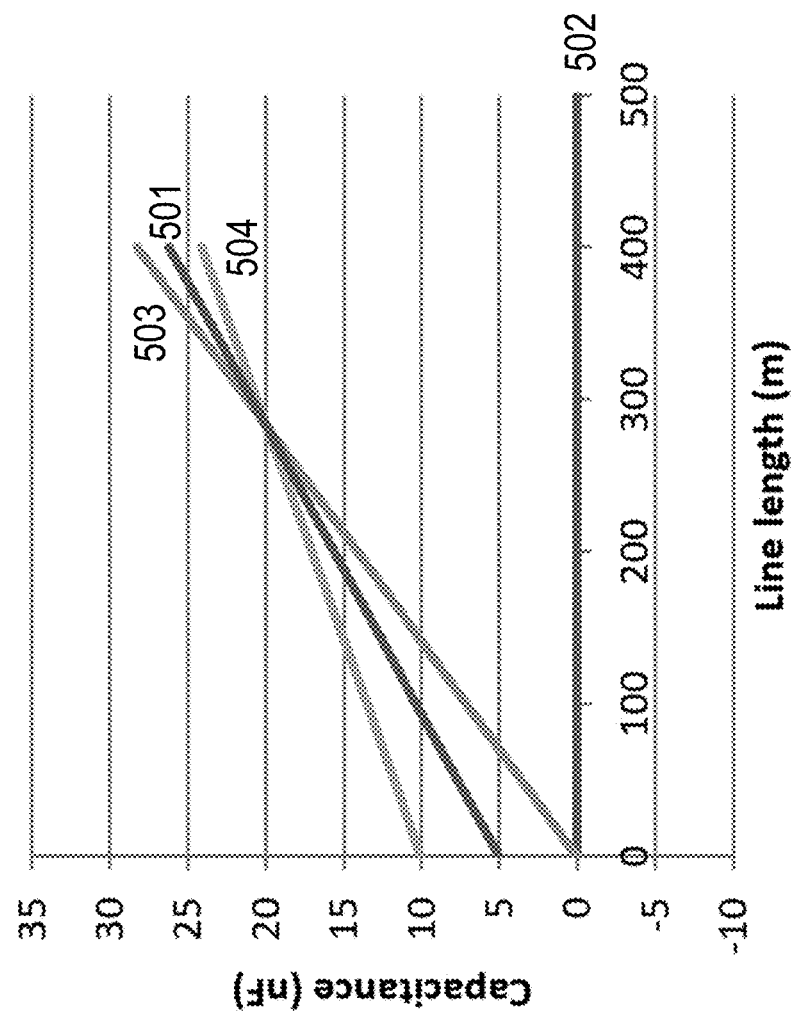
FIG. 5 shows an alternative diagram visualizing the line length in view of the capacitance with line length compensation in case the attenuation per loop length or capacitance values is/are not exactly known.

FIG. 5 shows an alternative diagram visualizing the line length in view of the capacitance with line length compensation in case the attenuation per loop length or capacitance values is/are not exactly known.

A curve 501 shows a threshold.

A curve 502 depicts the lowest possible measured capacitance value when an SWI is present assuming that the interruption is close to DPU. In this example, the capacitance measured amounts to (substantially) 0 F.

A curve 503 shows the highest possible measured capacitance value when an SWI is present assuming that the interruption is close to the CPE 106. Hence, the capacitance measured merely shows the line capacitance $C_{line}$ without the CPE capacitance $C_{CPE}$.

A curve 504 shows the lowest possible measured capacitance when no SWI is present. Hence, the capacitance measured shows both, the line capacitance $C_{line}$ and the CPE capacitance $C_{CPE}$.

In contrast to FIG. 4, the curves in FIG. 5 depict what happens if the values are unknown and the line capacitance per electrical length may vary from 1 nF/dB to 2 nF/dB. This could be considered as a worst case regarding the k10 value based line length compensation.

The curve 504 is based on 1 nF/dB instead of 1.5 nF/dB line capacitance and the curve 503 increases from 1.5 nF/dB to 2 nF/dB. Both curves 503 and 504 intersect at a line length amounting to 300 m.

That means that in this example an SWI detection beyond a line length of 300 m may not be possible. Also, the detection becomes less robust against measurement errors the closer the line length gets to 300 m.

On the other hand, a line length of 300 m may be much longer than what is actually necessary for targeted G.fast deployments.

It is noted that k10 may be affected by the SWI. For example, k10 measured during the SWI will be higher compared to k10 measured without the SWI being present. This may lead to an overestimation of the loop length and may thus result in a higher estimated line capacitance and therefore makes the SWI detection more reliable.

The detection of an SWI as described may utilize MELT. This may be time consuming, also MELT resources are limited. If an actual k10 value does not differ much (e.g., by less than 0.3 dB) from a previous k10 value, it may be likely that there is no change concerning SWI. In this case it may not be necessary to initiate another MELT.

For example, the k10 value can be determined by the DPU and/or the CPE. The CPE's k10 value is transmitted to the DPU. The DPU may thus decide which k10 to select. For further details, reference is made to ITU G.9701.

MELT may be conducted according to ITU G.996.2.

Creating a short circuit on the line also causes k10 to change but the subsequent MELT may not produce a valid capacitance result. Hence, if MELT may indicate an invalid capacitance, this may be regarded as "no SWI".

Alternative line capacitance estimation methods

Instead of estimating the line length and the line capacitance value using the line attenuation, the line length and associated capacitance value may be estimated from its propagation delay.

Two length estimation methods (ToD and Tg methods) using standard compliant test and reporting parameters are described in US 2019/0036800 A1. Methods using the propagation delay to estimate the loop length may be more accurate than attenuation based techniques.

The ToD method

The most accurate technique involves the utilization of the ToD messages exchanged between the DPU and the CPE (ITU-Recommendation G.9701, clause 8.5). It is an option to implement the ToD method in only a selection (and not all) of the DPUs and/or CPEs.

Most cables have a propagation speed of about 0.7 times the speed of light. Hence, the capacitance per delay is about $$\frac{50\,\text{pF}}{m} \cdot 3 \cdot 10^8 \frac{m}{s} \cdot 0.7.$$

The Tg method

This method also measures the line propagation delay and is based on a gap timing in the TDD frame. The Tg processing (ITU-Recommendation G.9701, clause 10.5) is partially vendor specific. That is why it may be necessary to check the DPU's and the CPE's inventory information to adjust the delay results accordingly. The capacitance per delay is also in the order of $$\frac{50\,\text{pF}}{m} \cdot 3 \cdot 10^8 \frac{m}{s} \cdot 0.7.$$

SWI detection procedure

Depending on the expected environment and the detection method, the DPU containing the detection algorithm may in particular utilize at least two parameters. These parameters can be either fixed in the detection algorithm or they can be configurable by an operator.

The line capacitance $C_{line}$ can be determined based on parameters that are derived from either the k10 method (resulting in a parameter Cm) or the ToD or Tg method (resulting in a parameter $C_{delay}$).

These parameters $C_{k10}$ and $C_{delay}$ may be configured by an operator to meet the demands of the network. Also, these parameters $C_{k10}$ and $C_{delay}$ may be fixed pursuant to an initial estimation. Also, both approaches may be combined.

After each line has been initialized, the line capacitance $C_{line}$ may be determined as follows, depending on the method used:

$C_{line}=C_{k10} \cdot k10$ in case the k10 method is used, or $C_{line}=C_{delay} \cdot \text{delay}$ in case the ToD or the Tg method is used.

Figure 7:
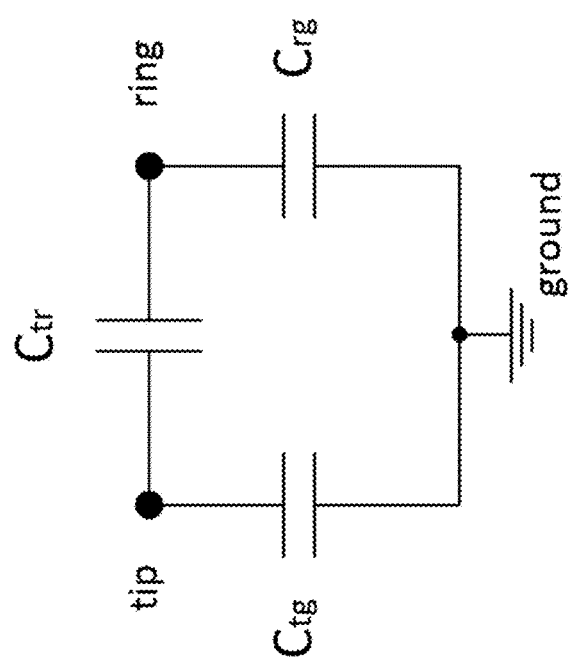
FIG. 7 shows a circuit diagram comprising capacitance values Ctr, Crg and Ctg that can be measured using MELT.

FIG. 7 shows a circuit diagram comprising capacitance values $C_{tr}$, $C_{rg}$ and $C_{tg}$ that can be measured using MELT. Nodes tip and ring visualize the two wires of the line.

The capacitance $C_{tg}$ is arranged between the node tip and ground, the capacitance $C_{rg}$ is arranged between the node ring and ground and the capacitance $C_{tr}$ is located between the nodes tip and ring.

For line length estimation purposes, an overall capacitance $C_{meas}$ is determined between the two wires indicated by the nodes tip and ring. This capacitance $C_{meas}$ can be calculated based on the three values determined by MELT as follows:

$$C_{meas} = C_{tr} + \frac{1}{\frac{1}{C_{rg}} + \frac{1}{C_{tg}}}.$$

The SWI may be considered to be present, if the MELT capacitance measurement is indicated as valid and if $$C_{meas} - C_{line} < \frac{C_{CPE}}{2}.$$

Otherwise SWI is considered as not present.

Instead of the exemplary threshold $C_{CPE}/2$, any value between $C_{CPE}$ and 0 may be used.

Alternatively, if only short loops are used (i.e. $C_{line} < C_{CPE}$), the line capacitance may be negligible. In such case, a length compensation is not necessary and the SWI is considered to be present, if the MELT capacitance measurement is indicated as valid and if $C_{tr} < C_{CPE-\varepsilon}$, otherwise SWI is considered as not present. $\varepsilon$ may indicate a tolerance that stems from measurement discrepancy and/or from a variance of the CPE's capacitance.

Figure 6:
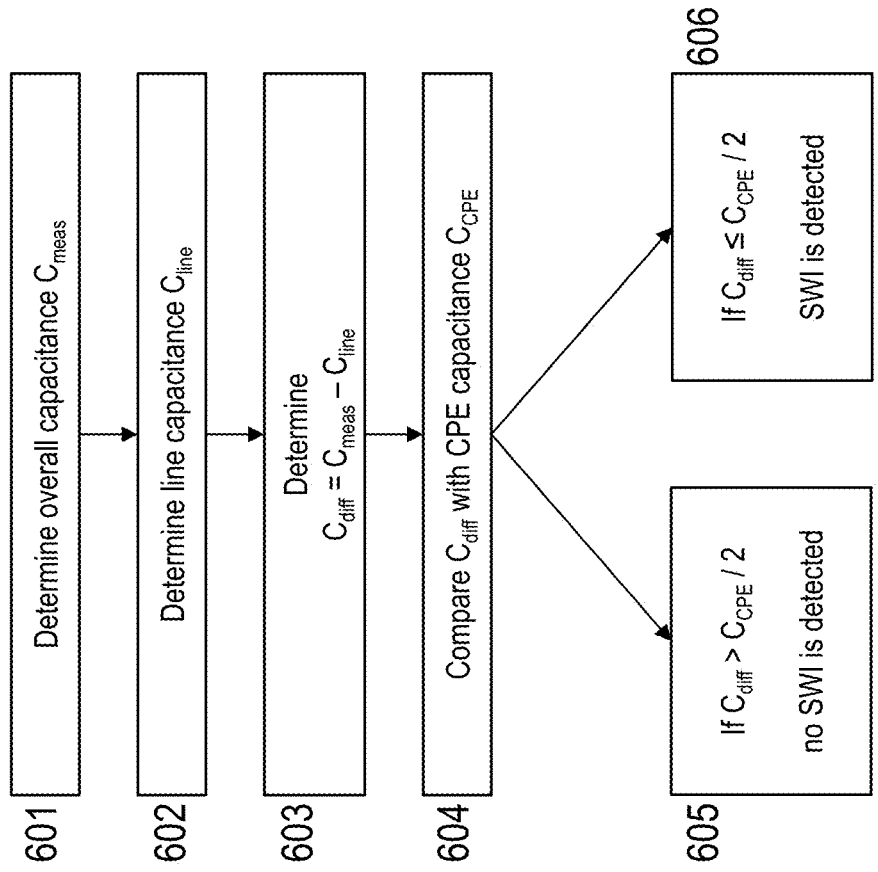
FIG. 6 an exemplary flow chart comprising steps to detect a single wire interruption (SWI)

FIG. 6 shows an exemplary flow chart comprising steps to detect a single wire interruption (SWI).

In a step 601, the overall capacitance $C_{meas}$ is determined, which is expected to be the sum of the CPE capacitance $C_{CPE}$ (in case there is no SWI) and the line capacitance $C_{line}$.

This step 601 may be triggered by the DPU or by a DSLAM or by any central entity. The overall capacitance $C_{meas}$ is determined for a line comprising two wires. The line may be connected to a CPE or any terminal device. Reference is made to the examples shown in FIG. 1 and FIG. 2.

In a step 602 the line length is determined, which can be done based on an attenuation or based on a signal propagation delay. Both are exemplarily described above.

Utilizing a predetermined line capacity of, e.g., 50 pF/m, the line capacity $C_{line}$ can be determined applying the previously determined line length.

In a step 603, a capacitance difference $C_{diff}$ is determined based on the overall capacitance $C_{meas}$ and the line capacitance $C_{line}$ as follows:

$C_{diff}=C_{meas}-C_{line}.$

In a step 604, the capacitance difference $C_{diff}$ is compared with the capacitance $C_{CPE}$. If the capacitance difference $C_{diff}$ is larger than the capacitance $C_{CPE}/2$, no SWI is detected (see step 605). If the capacitance difference $C_{diff}$ is smaller or equal than the capacitance $C_{CPE}/2$, the SWI is detected (see step 606).

After step 605, the whole detection may be reiterated, e.g., after a predetermined delay or immediately.

After step 606, a predefined action may be triggered. This is described in the next section.

Actions after Detecting the SWI

After detection of the SWI, the power spectral density (PSD) transmitted over the line can be automatically modified to reduce the line's impact on the vectoring system. That may imply deactivating the line completely or limiting the utilized frequency range.

Returning to the normal PSD can happen manually by the operator or automatically after a predetermined (e.g., fixed or configurable) amount of time has elapsed without still detecting the SWI.

Additionally, a DPU management system may be informed of the SWI being detected (and/or no longer being detected). The DPU may hence notify the operator, e.g., via an alarm or any other notification.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

LIST OF ABBREVIATIONS

AN Access Node
CPE customer premises equipment (terminal)
DPU distribution point unit
DSL Digital Subscriber Line
DSLAM DSL Access Multiplexer
FAST Fast Access To Subscriber Terminals
FEXT far-end-crosstalk
FTTB fiber to the building
FTU-O FAST Transceiver Unit at the optical network unit
FTU-R FAST Transceiver Unit at the remote site (i.e., subscriber end of the loop)
MELT Metallic Line Testing
MSAN Multi Service Access Node
PSD power spectral density
RFI Radio Frequency Interference
TDD Time Division Duplex

The invention claimed is:

1. A method for detecting a single wire interruption of a line comprising two single wires, wherein such line is part of a vectoring group, comprising:
   determining an overall capacitance measured between the two single wires of the line;
   determining a line capacitance of the line;
   determining a terminal capacitance of a terminal connected to the line; and
   determining that a single wire interruption is present in at least one of the two single wires based on a difference between the overall capacitance and the line capacitance being less than the terminal capacitance.

2. The method according to claim 1, wherein the vectoring group is utilized by a vectoring system.

3. The method according to claim 2, wherein the vectoring system utilizes a G.fast service.

4. The method according claim 2, wherein vectoring system utilizes a start frequency of at least 1 MHz, in particular 2.2 MHz.

5. The method according to claim 1, wherein determining the overall capacitance comprises determining the overall capacitance via metallic line testing (MELT).

6. The method according to claim 1, wherein determining the line capacitance comprises determining the line capacitance based on an attenuation of a signal and/or based on a signal propagation delay.

7. The method according to claim 1, wherein determining that the single wire interruption is present comprises determining that the following condition is met:

$$C_{meas} - C_{line} < th,$$

wherein
$C_{meas}$ indicates the overall capacitance,
$C_{line}$ indicates the line capacitance, and
th is the specified value selected from $C_{CPE}/2$ or a range around $C_{CPE}/2$, wherein $C_{CPE}$ is the CPE capacitance.

8. The method according to any of the preceding claims, which is run on a central unit, in particular a distribution point unit (DPU), a digital subscriber line access multiplexer (DSLAM), a multi service access node (MSAN) or a media converter.

9. The method according to claim 1, wherein a predetermined action is triggered in case of at least one of the following:
   a single wire interruption is detected;
   a single wire interruption is not detected;
   a single wire interruption is no longer detected.

10. The method according to claim 9, wherein the predetermined action comprises at least one of the following:
    issuing a notification, in particular an alarm notification;
    using a reduced frequency range after the single wire interruption has been detected;
    deactivating the line for which the single wire interruption has been detected;
    using a reduced transmit power; or
    using a reduced power spectral density level.

11. A central communication device comprising a processing unit that is arranged to conduct the following steps:
    determining an overall capacitance between two single wires of a line, wherein such line is part of a vectoring group;
    determining a line capacitance of the line;
    determining a terminal capacitance of a terminal connected to the line; and
    determining that a single wire interruption is present in at least one of the two single wires based on a difference between the overall capacitance and the line capacitance being less than the terminal capacitance.

12. The device according to claim 11, wherein the device is a distribution point unit (DPU), a digital subscriber line access multiplexer (DSLAM), a multi service access node (MSAN) or a media converter.

13. A non-transitory computer readable medium storing code portions that cause a digital processing device to perform operations comprising:
    determining an overall capacitance between two single wires of a line, wherein such line is part of a vectoring group;
    determining a line capacitance of the line;
    determining a terminal capacitance of a terminal connected to the line; and
    determining that a single wire interruption is present in at least one of the two single wires based on a difference between the overall capacitance and the line capacitance being less than the terminal capacitance.

14. The non-transitory computer readable medium of claim 13, wherein determining that the single wire interruption is present comprises determining that the following condition is met:

$$C_{meas} - C_{line} < th,$$

wherein $C_{meas}$ indicates the overall capacitance,
$C_{line}$ indicates the line capacitance, and
th is the specified value selected from $C_{CPE}/2$ or a range around $C_{CPE}/2$, wherein $C_{CPE}$ is the CPE capacitance.

\* \* \* \* \*